United States Patent
Pilch

(10) Patent No.: US 9,688,569 B2
(45) Date of Patent: Jun. 27, 2017

(54) ETCHING APPARATUS AND METHOD

(71) Applicant: Infineon Technologies AG, Neubiberg (DE)

(72) Inventor: Karl Pilch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 14/820,344

(22) Filed: Aug. 6, 2015

(65) Prior Publication Data

US 2015/0348852 A1     Dec. 3, 2015

Related U.S. Application Data

(62) Division of application No. 13/587,458, filed on Aug. 16, 2012, now Pat. No. 9,145,332.

(51) Int. Cl.
| | |
|---|---|
| *C03C 25/68* | (2006.01) |
| *C03C 15/00* | (2006.01) |
| *H01L 21/306* | (2006.01) |
| *H01L 21/02* | (2006.01) |
| *H01L 21/67* | (2006.01) |
| *H01L 21/66* | (2006.01) |

(52) U.S. Cl.
CPC ........ *C03C 15/00* (2013.01); *H01L 21/02019* (2013.01); *H01L 21/30604* (2013.01); *H01L 21/6708* (2013.01); *H01L 21/67115* (2013.01); *H01L 21/67248* (2013.01); *H01L 22/12* (2013.01); *H01L 22/26* (2013.01); *H01J 2237/2001* (2013.01); *H01L 21/30608* (2013.01)

(58) Field of Classification Search
USPC .......................................................... 216/55
See application file for complete search history.

(56) References Cited

U.S. PATENT DOCUMENTS

| | | |
|---|---|---|
| 4,873,162 A | 10/1989 | Yoshioka et al. |
| 6,503,636 B1 | 1/2003 | Le Masson et al. |
| 6,547,919 B2 | 4/2003 | Bang |
| 6,786,996 B2 | 9/2004 | Emami |
| 6,953,515 B2 | 10/2005 | Boyd et al. |
| 7,001,481 B2 | 2/2006 | Sandhu et al. |
| 7,488,957 B2 | 2/2009 | Ekberg et al. |
| 8,075,732 B2 | 12/2011 | Partlo et al. |
| 8,163,129 B2 | 4/2012 | Lee |
| 8,187,434 B1 | 5/2012 | Lee et al. |
| 8,319,150 B2 | 11/2012 | Lawrence et al. |
| 2002/0013064 A1 | 1/2002 | Bang |
| 2003/0073309 A1 | 4/2003 | Emami |
| 2003/0102008 A1 | 6/2003 | Sandhu et al. |
| 2004/0071960 A1 | 4/2004 | Weber et al. |
| 2006/0097355 A1 | 5/2006 | Bauer et al. |
| 2006/0222821 A1 | 10/2006 | Masai |
| 2009/0097022 A1 | 4/2009 | Shen et al. |
| 2011/0020978 A1 | 1/2011 | Wieting |
| 2014/0051257 A1 | 2/2014 | Pilch |

FOREIGN PATENT DOCUMENTS

| | | |
|---|---|---|
| CN | 1773682 A | 5/2006 |
| DE | 3727678 A1 | 2/1988 |
| DE | 10019355 A1 | 10/2001 |
| DE | 10319206 A1 | 11/2004 |
| DE | 69916378 T2 | 5/2005 |
| EP | 0740139 A1 | 10/1996 |

*Primary Examiner* — Roberts Culbert

(74) *Attorney, Agent, or Firm* — Slater Matsil, LLP

(57) ABSTRACT

An etchant is supplied to a workpiece. Furthermore, the workpiece is irradiated with spatially modulated light to adjust a temperature profile of the workpiece while etchant is supplied.

11 Claims, 3 Drawing Sheets

ETCHING APPARATUS AND METHOD

This is a divisional application of U.S. application Ser. No. 13/587,458, now U.S. Pat. No. 9,145,332, entitled "Etching Apparatus and Method" which was filed on Aug. 16, 2012 and is incorporated herein by reference.

TECHNICAL FIELD

The present application relates to etching apparatuses and methods for etching a workpiece.

BACKGROUND

In many industrial processes, workpieces, for example wafers, are etched to change the form of the workpiece in some manner. For example, during wafer processing and manufacture wafers, e.g., semiconductor wafers may be etched, for example with the goal to level the wafer, i.e., reduce a total thickness variation (TTV) of the wafer. To give an example, in some cases the wafer thickness influences electrical properties of semiconductor devices formed on the wafer, and therefore a small thickness variation is desirable to reduce variations of the electrical properties of manufactured semiconductor devices. For example, it is expected that in the future thickness variations of ±1 µm will be demanded for 8 inch wafers or even larger wafers.

To level the wafer, etching processes like spin etch processes where an etchant is dispensed on a rotating wafer, are used. For such and other etching processes, it is desirable to locally control the etching rate.

SUMMARY OF THE INVENTION

According to an embodiment, a method is provided, comprising:
supplying an etchant to a workpiece to be etched, and
irradiating the workpiece with spatially modulated radiation to adjust a temperature profile of the workpiece while the etchant is being supplied to the workpiece.

According to another embodiment, an apparatus is provided, comprising:
a radiation source, a spatial radiation modulator, an etchant supply and a workpiece holder as well as a control unit configured to control the spatial radiation modulator to modulate radiation from the radiation source to a workpiece on the workpiece holder to adjust a temperature profile of the workpiece while the etchant is being supplied to the workpiece from the etchant supply.

The above summary is merely intended to provide a short overview over some features of some embodiments of the invention and is not to be construed as limiting, as other embodiments may comprise other features than the ones indicated above.

DETAILED DESCRIPTION OF ILLUSTRATIVE EMBODIMENTS

Figure 1:
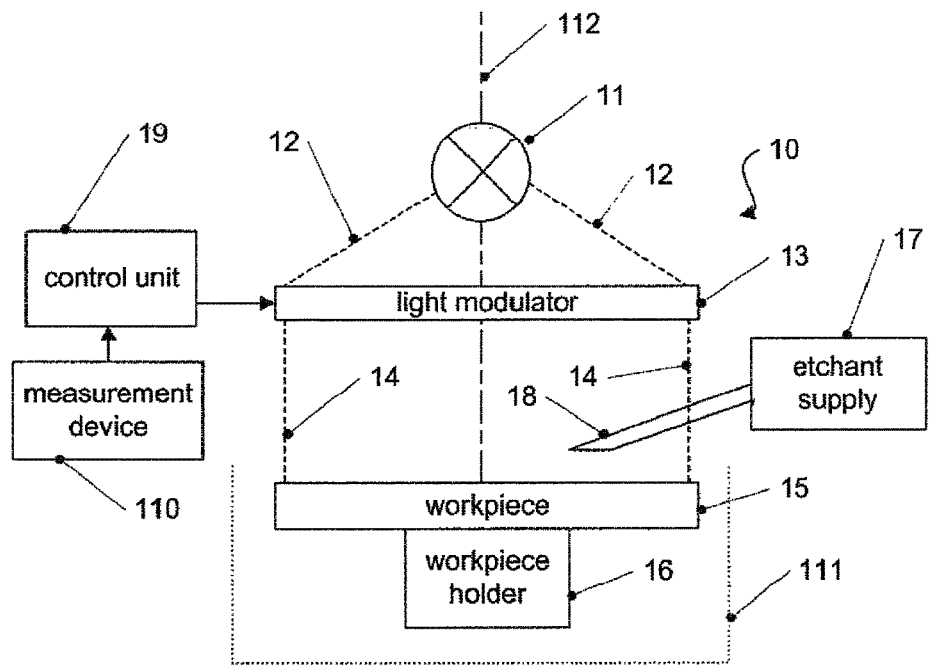
FIG. 1 is a block diagram of an etching apparatus according to an embodiment.

In the following, embodiments of the present invention will be described in more detail with reference to the attached drawings. However, it is to be noted that the scope of the invention is not limited to the embodiments shown in the drawings or described herein.

Features of different embodiments may be combined with each other unless noted otherwise. On the other hand, describing an embodiment with a plurality of features is not to be construed as indicating that all those features are necessary for practicing the invention, as other embodiments may comprise less features and/or alternative features.

The drawings are provided to give an understanding of the embodiments represented, and therefore various elements shown in the drawings are not necessary to scale with each other. Any directional references to the drawings like top, bottom, left or right are merely chosen as convenient for referring to various elements in the drawings and are not to be construed as indicating an actual location of the elements in implementations of the embodiments.

Turning now to the figures, FIG. 1 illustrates an etching apparatus 10 for etching a workpiece 15 according to an embodiment. Workpiece 15 may for example be a semiconductor wafer like a silicon wafer, but may also be any other workpiece to be etched, for example a semiconductor workpiece other than a wafer or a metal workpiece.

Etchant may be sprayed or dispensed on workpiece 15 from an etchant supply 17 via a nozzle 18, while workpiece holder 16 rotates workpiece 15 about a rotational axis 112. The etchant thus supplied may be selected depending on the kind of workpiece 15 to be etched, for example depending on the material of workpiece 15. Any conventional etchant used for the respective material may be used, for example an etchant based on potassium hydroxide in case of silicon to be etched. In some embodiments, in case of a rotating workpiece holder nozzle 18 may have an opening on rotation axis 112 to supply etchant centrally to the wafer.

In other embodiments, etchant may be supplied in a different manner to workpiece 15. For example, workpiece 15 may be submersed in an etchant provided in an etching bath 111, just to give an example for a different way of supplying etchant.

Etching apparatus 10 further comprises a radiation source, e.g., a light source 11 which emits light beams 12 and a light modulator 13 which spatially modulates light beams 12 to become spatially modulated light beams 14 irradiating workpiece 15. In particular, through light modulator 13 the light intensity, i.e., the power, on workpiece 15 may be spatially modulated such as to locally heat workpiece 15. Light source 11 may be any suitable light source, for example a white light source, which emits light of sufficient power which is sufficiently absorbed by workpiece 15. For example, in an embodiment workpiece 15 is intransparent to light emitted by light source 11. In case of a workpiece made of silicon, light source 11 may for example emit light in the visible range. A power of light source 11 may be selected such that a maximum light intensity on workpiece 15 is at least 1 W/cm², for example at least 5 W/cm².

Light modulator 15 may be any kind of light modulator which allows a spatial modulation of the light intensity on workpiece 15, for example in an adjustable manner. Light modulator 13 may for example comprise a micromirror array, for example a digital micromirror device (DMD) like a digital light processing (DLP) chip. In such a case, each micromirror either guides light to workpiece 15 or prevents light from reaching workpiece 15. By providing an array of such micromirrors, the spatial light distribution on workpiece 15 may be controlled by actuating the individual micromirrors accordingly. Such micromirrors may for example be implemented as microelectromechanical systems (MEMS). In other embodiments, a LCD (Liquid Crystal Display) array may be used, where individual pixels of the display may be either transparent or intransparent to light depending on a control signal. In case an adjustable control of the spatial distribution is not needed, for example also a mask may be used to provide a fixed spatial modulation.

By modulating the light intensity, as already mentioned above, workpiece 15 may be locally heated while etchant from etchant supply 17 is supplied to workpiece 15 via nozzle 18. Supplying the etchant provides some measure of cooling to workpiece 15, which for example may prevent overheating and/or may establish a stable temperature distribution on workpiece 15. By locally heating workpiece 15, an etching rate of the supplied etchant may be controlled. Like most chemical reactions, the chemical reaction underlying the etching process is temperature-depending. Typically, for example an increase of the temperature of 10° C. may double the etching rate. Therefore, even by locally heating the workpiece 15 only by some ° C., for example 2 or 3° C., the etching rate may be influenced in a significant manner.

Light modulator 13 in the embodiment of FIG. 1 is controlled by a control unit 19 which sets a desired light intensity profile to obtain a desired temperature profile and thus a desired etching rate distribution. For example, etching rates may be varied by controlling light modulator 13 accordingly to level workpiece 15, i.e., to increase the flatness, for example by increasing the etching rate at thicker portions of workpiece 15. In some embodiments, a measurement device 110 may be provided for obtaining a thickness profile of workpiece 15. Suitable measurement devices 110 may for example operate based on capacitive measurements, optical triangulation or interference-based measurements. Such measurements may for example be performed prior to the etching process, and control unit 19 may then control light modulator 13 based on a measured thickness profile and a look-up table or other calibration stored in control unit 19 to set the spatial light distribution accordingly. In some embodiments, workpiece 15 may again be measured after the etching, and the above-mentioned look-up table or other calibration may be adapted according to the results. For example, if the measurement after the etching shows that an etching rate was too low at a certain spot based on the calibration, for a next workpiece the light intensity in a similar situation may be increased to increase the temperature and therefore etching rate. Conversely, when an etching rate is found to be too high, the light intensity may be decreased to decrease the temperature and thus the etching rate. In some embodiments, a measurement may also be performed during etching, and the light intensity may be adjusted during the etching to obtain a desired etching profile.

Control unit 19 may be any kind of suitable computing device, for example a computer.

It should be noted that in embodiments where workpiece holder 16 rotates workpiece 15, light modulator 13 may in some embodiments only be provided on one side of axis 112 to illuminate a strip or line on workpiece 15. By the rotation, then the complete workpiece is irradiated with radiation from light source 11. In such embodiments, for example rotationally symmetric irradiation patterns and therefore rotationally symmetric temperature profiles may be obtained.

Figure 2:
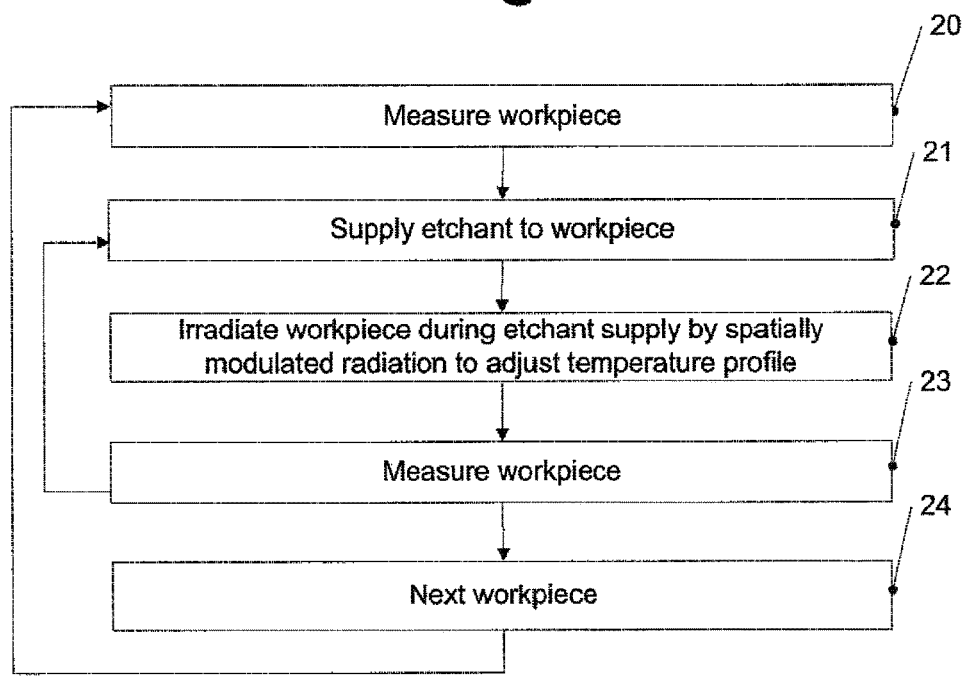
FIG. 2 is a flow chart illustrating a method according to an embodiment.

In FIG. 2 a flowchart illustrating a method according to an embodiment is shown. The method illustrated in FIG. 2 may be implemented in the apparatus of FIG. 1, but may also be implemented in other etching apparatuses.

At 20, a thickness profile of a workpiece is measured. For example, a capacitive measurement, optical triangulation or an interference-based measurement or other measurements conventionally used in the art for obtaining thickness profiles may be used.

At 21, etchant is supplied to the workpiece, for example dispensed onto the workpiece while the workpiece is rotated, and at 22 during the supplying of etchant the workpiece is irradiated by spatially modulated radiation to adjust a temperature profile of the workpiece based on the measurement at 20. For example, in case the workpiece is to be leveled, radiation intensity may be higher at thicker portions of the workpiece and lower at thinner portions of the workpiece. The temperature profile may be a rotationally symmetric temperature profile, for example when the workpiece is rotated during the supplying of the etchant.

It is also to be noted that supplying the etchant provides a cooling to the workpiece in some cases, and the cooling via the etchant together with heating by the radiation may lead to a stable temperature profile.

At 23, the workpiece is measured again. This measuring at 23 may in some embodiments be performed simultaneously to the etching process at 21 and/or 22, and the supplying of etchant and the irradiation, in particular the modulation, may be modified based on the measuring at 23 until a desired profile is reached. In other embodiments, the measuring at 23 is performed after the etching process at 21, 22. In some embodiments, when the results of the measurement at 23 are not satisfying, for example if a profile after etching does not match an intended profile sufficiently, the workpiece may again be subjected to an etching with irradiation, i.e., the operations described with respect to 21 and 22 may be repeated. In other embodiments, after the measuring of the workpiece at 23, a next workpiece is processed starting at 24 (for which then the operations described with respect to 20 to 23 are performed) and the results of the measurement at 23 may be used for improving parameters like the spatial modulation of the radiation for the next workpiece.

Figure 3A:
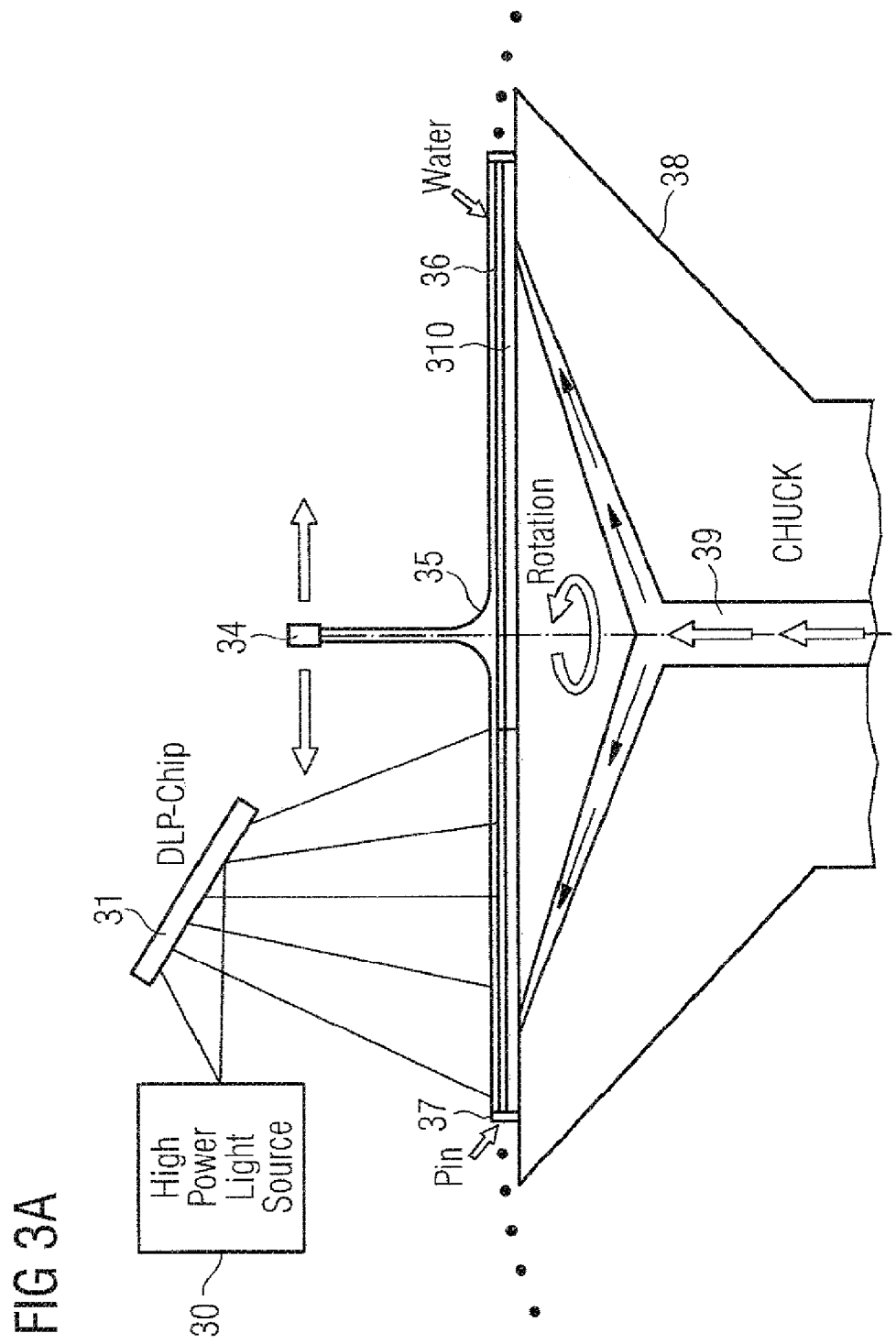
FIG. 3A shows a schematic diagram of an apparatus according to an embodiment.
Figure 3B:
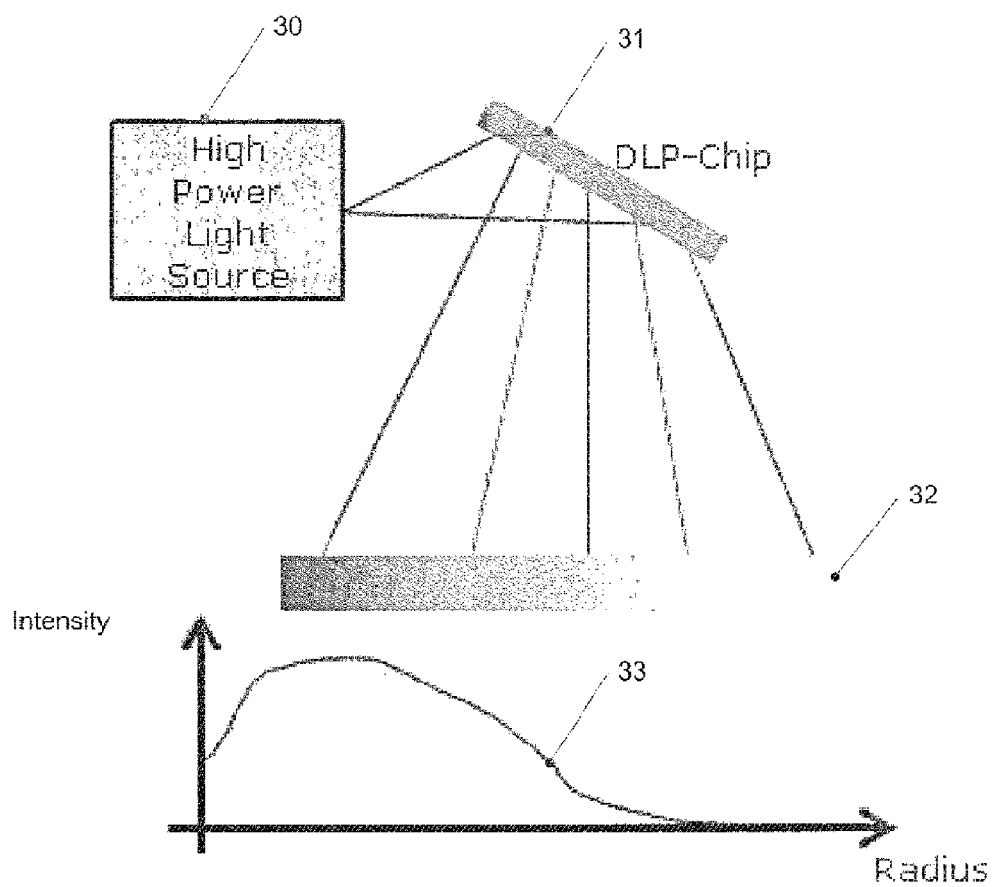
FIG. 3B illustrates a part of an apparatus according to an embodiment together with an example for a light intensity distribution.

In FIG. 3, an apparatus according to a further embodiment is shown, FIG. 3A showing the complete apparatus and FIG. 3B showing a part thereof together with an example for an intensity profile. The embodiment of FIG. 3 comprises a high power light source 30 emitting light to irradiate and thus heat a workpiece 36, for example a wafer. Between high power light source 30 and workpiece 36 a DLP chip 31 is provided serving as a light modulator. In other words, via DLP chip 31 the spatial distribution of light intensity on workpiece 36 may be modulated. In the example shown, toward the left a higher light intensity corresponding to a higher intended temperature is present, and to the right a lower intensity corresponding to a lower temperature is present. Workpiece 36 may for example be a wafer on a chuck 38 acting as a rotating wafer holder onto which an etchant is dispensed, for example as explained with reference to FIG. 1. In this case, the left part of workpiece 36 may represent the center of the wafer, and the right part may represent the periphery of the wafer.

An example for a resulting intensity profile is shown as a curve 33 in the lower half of FIG. 3B and as a greyscale profile 32, darker greys in profile 32 denoting a higher intensity. In this example, a radially symmetric intensity distribution is assumed, which for example may be achieved using a rotating workpiece holder and thus a rotating workpiece as explained above. In this example, from a center of the workpiece (radius 0) the intensity first increases and then drops again towards the edge of the workpiece.

As can be seen in FIG. 3A, workpiece 36, for example a semiconductor wafer, for which intensity profile 32, 33 as shown as an example in FIG. 3B is obtained, is provided on chuck 38 between pins 37. An etchant dispenser 34 which may be movable in a plane parallel to a surface of workpiece 36 dispenses etchant 35 onto the workpiece. Inside chuck 38, a channel 39 is provided through which gas, for example nitrogen, may be supplied such that workpiece 36 rests on a gas cushion, for example a nitrogen cushion. As indicated in FIG. 3A, chuck 38 in the embodiment shown in rotatable.

As also shown in FIG. 3A, with high power light source 38 and DLP chip 31 only one side of wafer 36 in the cross-sectional view is irradiated (for example in form of a strip or line on workpiece 36), and through the rotation of chuck 38 a rotationally symmetric temperature profile may be obtained. However, it should be noted that in other embodiments no rotation is provided, and for example essentially a complete face, for example an upper surface or even more than one face may be irradiated to obtain a desired temperature profile.

It should further be noted that rotationally symmetric thickness profiles in some industrial processes are often present, as for example during wafer manufacture also other processes like grinding, lapping, Taiko grinding or mounting are rotationally symmetric processes.

It should be noted that in some embodiments the etchant used may be a non-photoactive etchant, i.e., an etchant which does not require light for the etching process. In other embodiments, the etching reaction may be a photochemical reaction activated by light. In this case, in some embodiments light from light source like high power light source 30 of FIG. 3 or light source 11 of FIG. 1 may be used to activate the etching process as well as for heating the wafer. In other embodiments, the light source of the embodiment described may emit light in a range not usable for activating the etching reaction such that the light source is only used to heat the wafer to establish a desired temperature, and an additional light source may be provided to activate the etching reaction. In such an embodiment, the actuation of the etching reaction and the temperature may be controlled separately.

While light has been used as an example for radiation in the embodiments above, it should be noted that radiation of any spectral range suitable for heating a respective workpiece may be used, e.g., infrared radiation.

As already emphasized, the above embodiments serve only as examples for illustrating some possibility of implementing the present invention, and the present invention is not restricted to these possibilities.

What is claimed is:

1. A method comprising:
supplying an etchant to a workpiece to be etched;
irradiating the workpiece; and
controlling a radiation by spatially modulating the radiation such that a temperature profile of the workpiece is adjusted to a desired temperature profile while the etchant is being supplied to the workpiece.

2. The method of claim 1, further comprising rotating the workpiece.

3. The method of claim 1, further comprising:
measuring a thickness profile of the workpiece prior to supplying the etchant; and
setting a spatial modulation of the radiation depending on the thickness profile.

4. The method of claim 1, further comprising:
measuring a thickness profile of the workpiece while supplying the etchant and irradiating the workpiece; and
adjusting a spatial modulation of the radiation depending on the measurement.

5. The method of claim 4, wherein measuring the thickness profile comprises performing at least one of a capacitive measurement, an optical triangulation measurement or an interference-based measurement.

6. The method of claim 1, further comprising:
measuring a thickness profile of the workpiece after termination of supplying the etchant and irradiating the workpiece; and
modifying a spatial modulation of the radiation for a next workpiece depending on the thickness profile.

7. The method of claim 6, wherein measuring the thickness profile comprises performing at least one of a capacitive measurement, an optical triangulation measurement or an interference-based measurement.

8. The method of claim 1, wherein the workpiece is a semiconductor wafer.

9. The method of claim 1, wherein irradiating comprises spatially modulating light from a radiation source with a power sufficient to irradiate the workpiece with a power density of at least 1 W/cm2.

10. The method of claim 1, wherein irradiating comprises controlling a spatial light modulator to generate a spatially modulated radiation.

11. The method of claim 10, wherein the spatial light modulator comprises at least one of a micromirror array or a liquid crystal display array.

* * * * *